US010903159B2

(12) United States Patent
Huber

(10) Patent No.: US 10,903,159 B2
(45) Date of Patent: Jan. 26, 2021

(54) ELECTRICAL CABLE

(71) Applicant: MD ELEKTRONIK GmbH, Waldkraiburg (DE)

(72) Inventor: Martin Huber, Obing (DE)

(73) Assignee: MD ELEKTRONIK GmbH

( * ) Notice: Subject to any disclaimer, the term of this patent is extended or adjusted under 35 U.S.C. 154(b) by 186 days.

(21) Appl. No.: 16/145,239

(22) Filed: Sep. 28, 2018

(65) Prior Publication Data

US 2019/0109073 A1  Apr. 11, 2019

(30) Foreign Application Priority Data

Oct. 9, 2017 (EP) .................................. 17195471

(51) Int. Cl.
| | |
|---|---|
| *H02G 15/18* | (2006.01) |
| *H01L 23/498* | (2006.01) |
| *H01B 7/18* | (2006.01) |
| *H01B 7/02* | (2006.01) |
| *H01R 12/59* | (2011.01) |
| *H01R 4/18* | (2006.01) |
| *H01L 23/552* | (2006.01) |
| *H01L 23/13* | (2006.01) |
| *H01R 9/03* | (2006.01) |

(Continued)

(52) U.S. Cl.
CPC ........... *H01L 23/4985* (2013.01); *H01B 7/02* (2013.01); *H01B 7/1875* (2013.01); *H01L 23/13* (2013.01); *H01L 23/49811* (2013.01); *H01L 23/552* (2013.01); *H01R 4/183* (2013.01); *H01R 9/03* (2013.01); *H01R 12/592* (2013.01); *H01R 13/6658* (2013.01); *H01R 4/023* (2013.01); *H01R 4/70* (2013.01); *H01R 13/719* (2013.01); *H01R 24/28* (2013.01); *H01R 2103/00* (2013.01); *H02G 15/18* (2013.01)

(58) Field of Classification Search
CPC ................. H01L 23/4985; H01L 23/13; H01L 23/49811; H01L 23/552; H01B 7/02; H01B 7/1875; H01B 7/00; H01B 7/0009; H01R 4/183; H01R 9/03; H01R 12/592; H01R 13/6658; H01R 4/023; H01R 4/70; H01R 13/719; H01R 24/28; H01R 2103/00; H02G 15/18; H02G 15/184; H02G 15/00; H02G 15/007
USPC ....... 174/88 R, 68.1, 68.3, 72 A, 77 R, 70 C, 174/95; 439/794, 210, 213, 620.01
See application file for complete search history.

(56) References Cited

U.S. PATENT DOCUMENTS

| | | | |
|---|---|---|---|
| 4,710,593 A | 12/1987 | Hall, Jr. et al. | |
| 6,935,897 B2 * | 8/2005 | Canfield | ................ H01R 13/22 439/620.01 |

(Continued)

FOREIGN PATENT DOCUMENTS

| | | |
|---|---|---|
| EP | 2541697 A1 | 1/2013 |
| WO | WO 9217922 A1 | 10/1992 |
| WO | WO 2017199136 A1 | 11/2017 |

*Primary Examiner* — Angel R Estrada
(74) *Attorney, Agent, or Firm* — Leydig, Voit & Mayer Ltd.

(57) ABSTRACT

An electrical cable includes at least two wires extending side by side along a longitudinal cable direction. The wires are electrically insulated from each other by an insulation. An electrical device is in electrical contact with the respective wires. A flexible carrier surrounds the wires annularly in cross section, and the electrical device is mounted on an inner side of the flexible carrier which faces the wires.

20 Claims, 17 Drawing Sheets

(51) Int. Cl.
  *H01R 13/66* (2006.01)
  *H01R 103/00* (2006.01)
  *H01R 24/28* (2011.01)
  *H01R 13/719* (2011.01)
  *H01R 4/70* (2006.01)
  *H01R 4/02* (2006.01)

(56) References Cited

U.S. PATENT DOCUMENTS

| | | | |
|---|---|---|---|
| 8,502,072 B2 * | 8/2013 | Gehrke | H01R 9/03 174/74 R |
| 10,468,789 B2 * | 11/2019 | Huber | H01R 9/031 |
| 2004/0110421 A1 | 6/2004 | Broman et al. | |
| 2013/0005183 A1 | 1/2013 | Decrock et al. | |

* cited by examiner

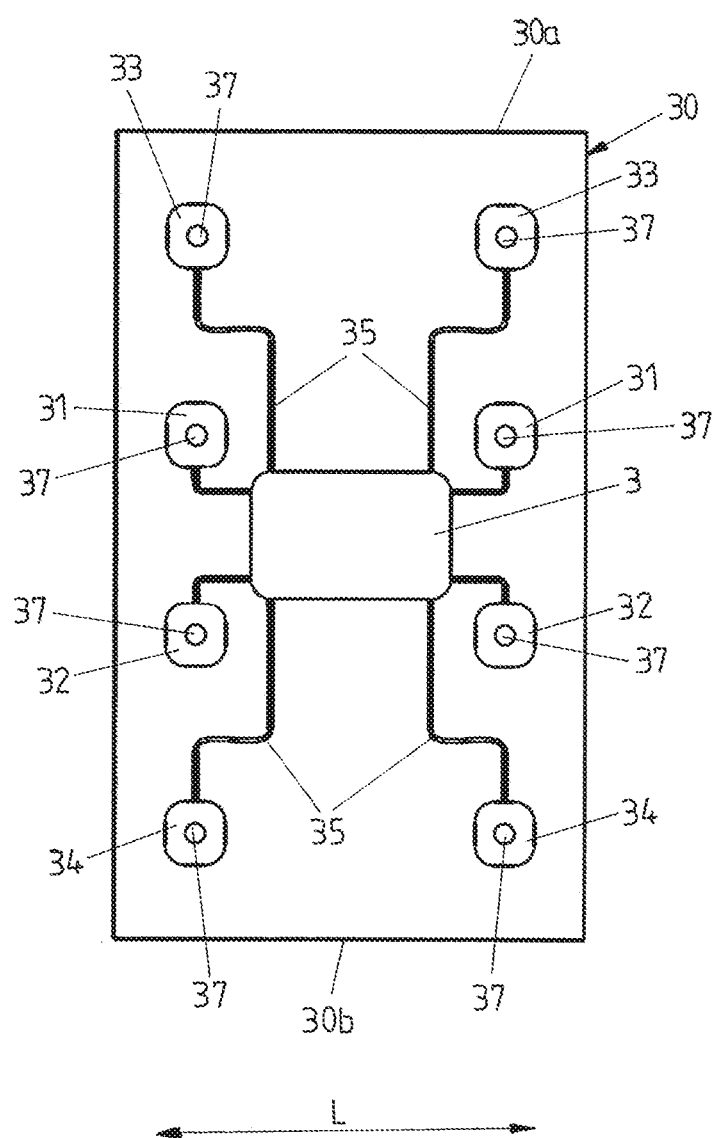

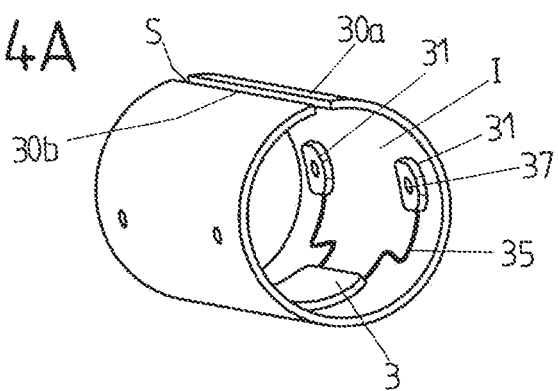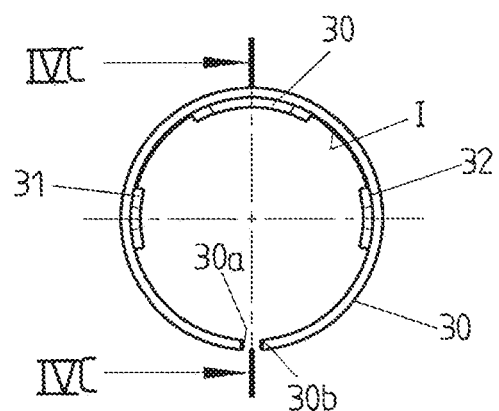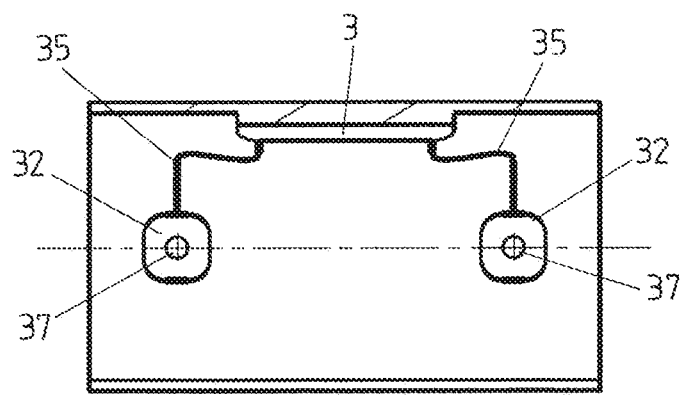

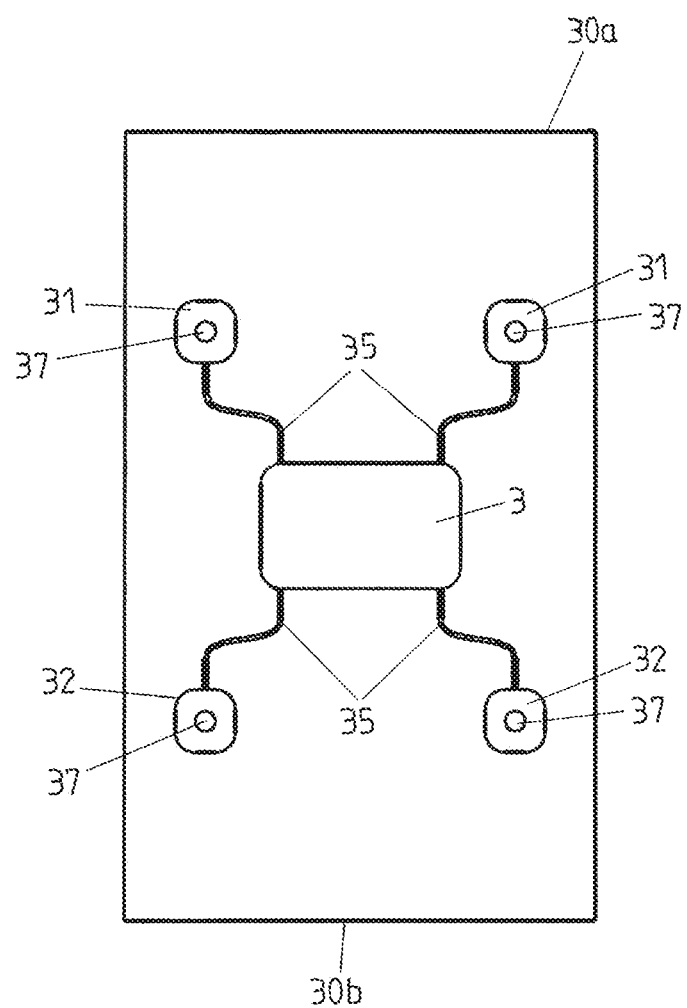

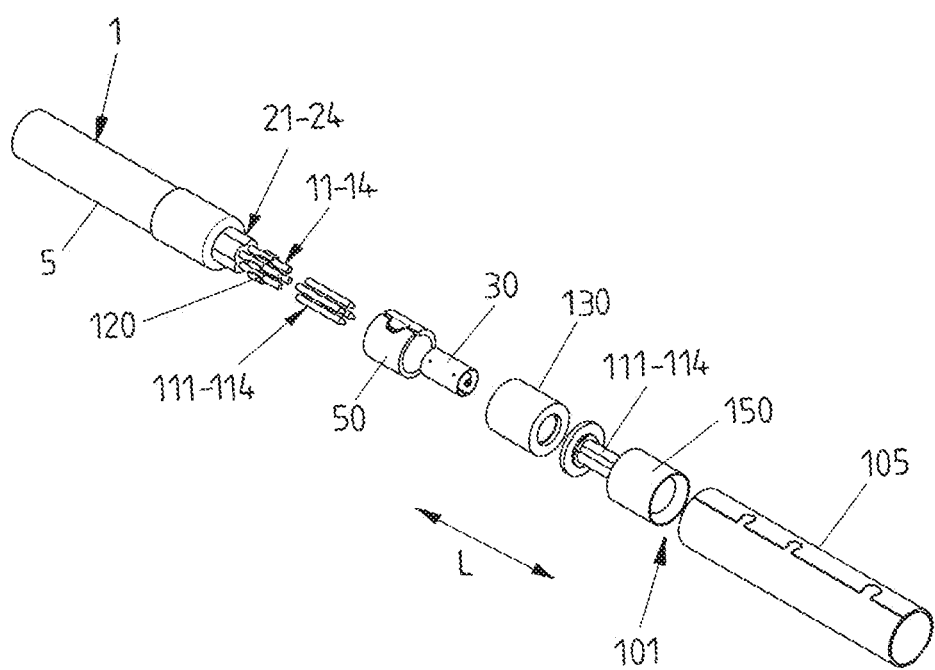

ELECTRICAL CABLE

CROSS-REFERENCE TO PRIOR APPLICATION

Priority is claimed to German Patent Application No. EP 17195471.2, filed on Oct. 9, 2017, the entire disclosure of which is hereby incorporated by reference herein.

FIELD

The present invention relates to an electrical cable, in particular in the form of a cable for data transmission in motor vehicles.

Such an electrical cable includes at least two wires extending side by side along a longitudinal cable direction, as well as an insulation by which the wires are electrically insulated from each other, and further includes an electrical device that is in electrical contact with the respective wires. The electrical insulation of the wires may be provided, for example, by each of the wires being surrounded in a known manner by an insulating sheath.

BACKGROUND

An electrical cable of this type having an electrical device integrated therewith is described, for example, in WO 2014/199136 A1.

SUMMARY

In an embodiment, the present invention provides an electrical cable. The electrical cable includes at least two wires extending side by side along a longitudinal cable direction. The wires are electrically insulated from each other by an insulation. An electrical device is in electrical contact with the respective wires. A flexible carrier surrounds the wires annularly in cross section, and the electrical device is mounted on an inner side of the flexible carrier which faces the wires.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 2D is a view showing the flexible carrier of FIG. 2A in flat, rolled-out form;

FIG. 4A is a view depicting a modification of the arrangement of FIG. 2A for a two-wire electrical conductor;

FIG. 4B is a transverse section through the arrangement of FIG. 4A;

FIG. 4C is a longitudinal section through the arrangement of FIG. 4A;

FIG. 4D is a view showing the flexible carrier of FIG. 4A in flat, rolled-out form;

FIG. 7A is a perspective exploded view of an electrical connector having a flexible carrier for holding an electrical device.

DETAILED DESCRIPTION

Figure 1A:
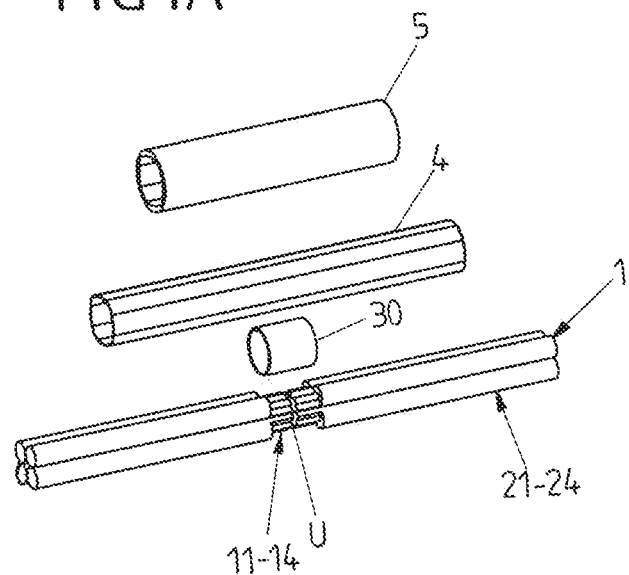
FIG. 1A is an exploded view of a multi-wire electrical cable having a flexible carrier which is annular in cross section and adapted to hold an electrical device.

Integrating an electrical device into an electrical cable has the advantage that this allows additional functions, such as signal filtering, to be performed directly in the cable itself.

In an embodiment, the present invention further improves a multi-wire electrical cable of the type mentioned above.

According to an embodiment of the present invention, in an electrical cable of the above-mentioned type, it is further provided that the electrical device be mounted on the inner side of a flexible carrier, which faces the wires of the cable, the flexible carrier surrounding (enclosing) the wires annularly in cross section.

By mounting the electrical device on a flexible carrier that surrounds or encloses the wires of the cable annularly in cross section, the carrier and the electrical device mounted thereon can be easily disposed between the thereby enclosed wires on one side, and, for example, an outer cable jacket or a possibly present cable shield on the other side.

In addition to the electrical device itself, the flexible carrier may also carry the electrical connecting elements via which the electrical device is in contact with the wires of the electrical cable and which may be spaced apart from the electrical device. To this end, for example, electrical conductors, in particular in the form of conductive traces, extend on the flexible carrier from the electrical device to the associated electrical connecting elements. The flexible carrier can contact the wires via these electrical connecting elements to establish an electrical connection.

The flexible carrier is in particular sufficiently flexible to be rolled up such that, in the rolled-up state, it encloses the wires of the electrical cable (sufficiently tightly) in a manner that allows the flexible carrier to be disposed between these wires and a covering of the cable, such as, for example, a cable shield and/or a cable jacket.

The electrical device mounted on the flexible carrier may be, in particular, a semiconductor device. Advantageously, the electrical device is also flexible, so that it can also be placed around the wires as the flexible carrier is rolled. Since, viewed along the circumferential direction of the flexible carrier, which is annular in cross section, the electrical device normally extends only over a portion of the extent of the flexible carrier (in the circumferential direction); i.e., unlike the flexible carrier, does not need to be rolled up over an angle of 360° or nearly 360°, the electrical device may, in some instances, have a lower flexibility than the associated carrier.

The electrical connecting elements may be configured, for example, as rigid electrical connection points projecting inwardly from the flexible carrier toward the wires of the cable. The connection points may, in particular, be rigid projections on the inner side of the flexible carrier.

In an embodiment of the present invention, the electrical connecting elements are each provided with a passage in alignment with an associated through-hole in the flexible carrier. This allows the flexible carrier to be fixed to the wires of the electrical cable through the passages of the connecting elements, and particularly so by material-to-material bonding, such as by soldering or welding. The material-to-material connection point at the same time ensures electrical contact between a respective wire and the associated connecting element on the flexible carrier.

In an embodiment of the present invention, for each of the wires of the electrical cable enclosed by the flexible carrier and to be electrically contacted to the electrical device mounted on the carrier, two connecting elements are provided on the flexible carrier and spaced from each other along the longitudinal direction of the cable, each of the two connecting elements being in electrical contact with the associated wire of the electrical cable.

Further, it may be provided that at least one of the wires have a discontinuity at the location where the electrical device and the associated flexible carrier are disposed, the discontinuity being bridged by the electrical device (and the electrical conductors provided on the flexible carrier, including the associated connecting elements). Alternatively, a respective wire may be configured such that it has no discontinuity in the region of the electrical device and the associated flexible carrier.

To allow the electrical device to be reliably electrically connected to a respective wire, the latter is at least partially freed from its insulation in the region of the electrical device. At the stripped portions of a respective wire, electrical contact can be made directly to the associated connecting elements of the flexible carrier.

At the location where the electrical device is disposed, the insulation of a respective wire may be removed in particular along the longitudinal extent of the associated flexible carrier (in the longitudinal cable direction).

Moreover, the flexible carrier may bear inwardly against the wires, and particularly so via the connecting elements disposed on the carrier against the stripped portions of the wires.

The flexible carried may be configured and sized to enclose all wires of the electrical cable.

The flexible carrier must extend along the longitudinal cable direction only so far as is necessary to hold the electrical device (including the associated electrical conductors and connecting elements via which the wires of the cable are contacted). Accordingly, the longitudinal extent of the flexible carrier along the longitudinal cable direction is typically small compared to the total length of the cable. Thus, the longitudinal extent of the flexible carrier along the longitudinal cable direction may in particular be less than 10% of the length of the electrical cable along this direction.

The wires of the electrical cable may be surrounded on the outside by a cable shield and/or a cable jacket, the flexible carrier being located within the space enclosed by the cable shield and/or the cable jacket.

FIGS. 1A through 1D show an electrical cable 1 extending along a longitudinal cable direction L. Electrical cable 1 includes a plurality of wires 11, 12, 13, 14 (in the exemplary embodiment four wires) extending side by side along longitudinal cable direction L. In the exemplary embodiment, wires 11, 12, 13, 14 of electrical cable 1 are each formed by a plurality of strands extending side by side along longitudinal cable direction L (compare FIG. 1D). The individual wires 11, 12, 13, 14 are electrically insulated from each other by an insulation 21-24. Insulation 21-24 is formed by separate insulating sheaths 21, 22, 23, 24, each surrounding a respective one of wires 11, 12, 13, 14 of electrical cable 1, thereby insulating the associated wire 11, 12, 13, 14 from the environment.

Wires 11, 12, 13, 14 of electrical cable 1 are freed from insulation 21-24 along a section thereof, so that wires 11, 12, 13, 14 can here be electrically contacted from the outside, for example, radially (transversely to longitudinal cable direction L). In the stripped region, wires 11, 12, 13, 14 of electrical cable 1 are surrounded by a flexible carrier 30, which encloses wires 11, 12, 13, 14 annularly in cross section (as a sheath). Specifically, in the exemplary embodiment, flexible carrier 30 has a hollow cylindrical shape, and thus is circularly annular in cross section.

Flexible carrier 30 is, for example, sufficiently flexible to be rolled up such that, in the rolled-up state, it encloses wires 11, 12, 13, 14 of electrical cable 1 (sufficiently tightly) in a manner that allows flexible carrier 30 to be disposed between these wires 11, 12, 13, 14 and a covering of cable 1, such as, for example, a cable shield 4 and/or a cable jacket 5.

The extent 1 of flexible carrier 30 in longitudinal cable direction L is many times smaller than the corresponding length of electrical cable 1, and may, for example, be less than 10% of the length of cable 1 (in longitudinal cable direction L).

Flexible carrier 30 extends transversely to longitudinal cable direction L from a first free end 30*a* to a second free end 30*b* and is annularly rolled up transversely to longitudinal cable direction L in such a way that free ends 30*a*, 30*b* are opposite each other. In the exemplary embodiment, a gap S exists between free ends 30*a*, 30*b*; i.e., free ends 30*a*, 30*b* are spaced apart in the circumferential direction of the (rolled-up) flexible carrier 30.

In the stripped region surrounded by flexible carrier 30, wires 11, 12, 13, 14 of electrical cable 1 each have a discontinuity U. This means that, in the stripped region, a respective wire 11, 12, 13, 14 is not continuous in the axial direction (along longitudinal cable direction L), but provided with a discontinuity U such that no direct signal or current flow is possible along the respective wire 11, 12, 13, 14 at this point.

An electrical device 3 is mounted on the inner side of flexible carrier 30; i.e., on the side facing wires 11, 12, 13, 14 of electrical cable 1, as will be described in more detail below with reference to FIGS. 2A through 2D, especially conjunction with FIG. 1D, the electrical device 3 being in electrical contact with wires 11, 12, 13, 14 of electrical cable 1 or, more specifically, with the stripped portions thereof. The electrical device may be, for example, a sensor, an RFID element, a bare die, or a filter.

Wires 11, 12, 13, 14 of the electrical cable, including flexible carrier 30, are surrounded on the outside by a cable shield 4, which may be formed, for example, by an electrically conductive sheath in the form of, for example, an electrically conductive (metallic) film.

The radially outermost layer of electrical cable 1 is formed by a cable jacket 5 that surrounds wires 11, 12, 13, 14 (including the associated insulation 21-24) as well as flexible carrier 30 and, where present, cable shield 4, in a sheath-like manner, thereby sealing electrical cable 1 from the outside.

With reference to FIGS. 2A through 2D, especially conjunction with FIG. 1D, the arrangement of device 3 on flexible carrier 30 and its contacting to wires 11, 12, 13, 14 of electrical cable 1 will be described in greater detail.

According to FIGS. 2A through 2D, electrical device 3 is mounted on flexible carrier 30 (namely on its inner side I facing the interior of the cable; i.e., wires 11, 12, 13, 14). Extending from electrical device 3 are electrical conductors 35, in particular in the form of conductive traces arranged on flexible carrier 30, and specifically on inner side I thereof. Electrical conductors 35 electrically connect electrical device 3 to electrical connecting elements 31, 32, 33, 34, via which electrical device 3 can be brought into electrical contact with wires 11, 12, 13, 14 of electrical cable 1 and, in the assembled state, is in electrical contact therewith.

Specifically, each of the (four) wires 11, 12, 13, 14 of electrical cable 1 has two electrical connecting elements 31; 32; 33; or 34 associated therewith on flexible carrier 30, which are respectively spaced from each other along longitudinal cable direction L and connected via electrical conductors 35 to electrical device 3. In the exemplary embodiment, the connecting elements (e.g., 31) associated with a wire (e.g., 11) of electrical cable 1 are disposed on both sides of electrical device 3 along longitudinal cable direction L. Connecting elements which belong together and are associated with one and the same wire (e.g., 11) are located at the same level transverse to longitudinal cable direction L. In the exemplary embodiment, connecting elements (e.g., 31 on the one hand, and 32 on the other hand) belonging to different wires (e.g., 11, on the one hand, and 12, on the other hand) are disposed at different levels transverse to longitudinal cable direction L.

The individual connecting elements 31, 32, 33, 34 are made of an electrically conductive material. In the exemplary embodiment, they are configured as (rigid) projections on flexible carrier 30, and more specifically on inner side I thereof. Furthermore, the individual connecting elements 31, 32, 33, 34 each have passages 37, which are in alignment with through-holes 36 in flexible carrier 30, as is apparent from FIG. 1D.

The electrical device 3 mounted on flexible carrier 30 may be, in particular, a semiconductor device. Advantageously, electrical device 3 is also flexible, so that it can also be placed around wires 11, 12, 13, 14 as flexible carrier 30 is rolled.

In the exemplary embodiment, electrical device 3 extends only over a portion of the extent of flexible carrier 30 both along longitudinal direction L and along the circumferential direction of the cross-sectionally annular flexible carrier 30. Alternatively, however, electrical device 3 may extend over the entire extent of flexible carrier 30 along the circumferential direction and/or along longitudinal direction L.

Figure 1B:
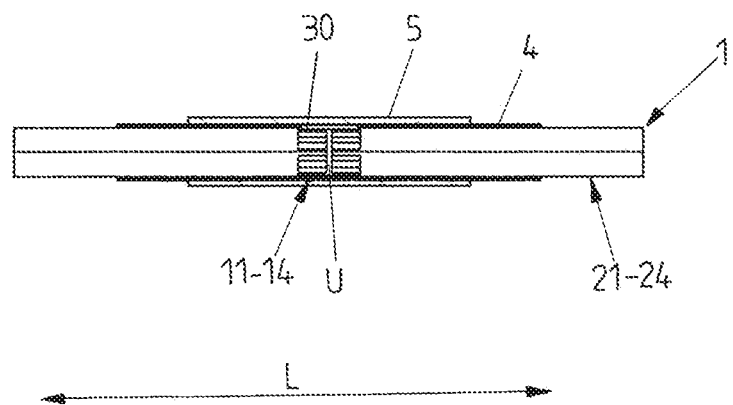
FIG. 1B is a longitudinal section through the electrical cable of FIG. 1A.
Figure 1C:
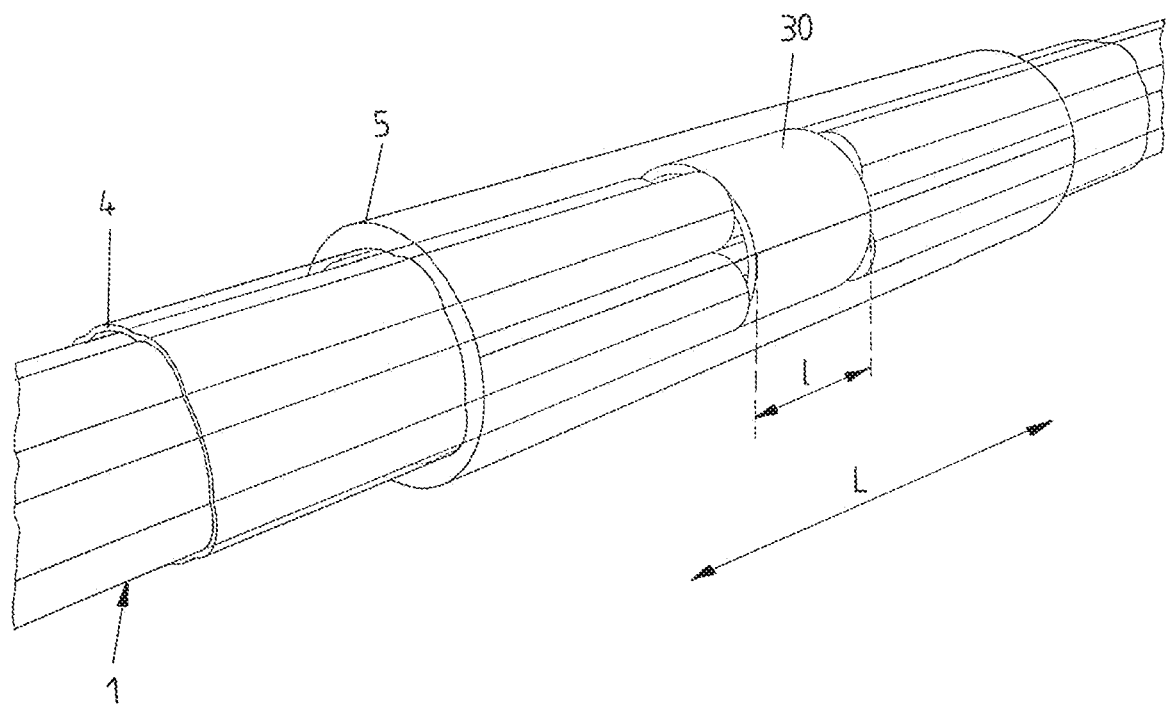
FIG. 1C is a perspective and partially transparent view of the electrical cable of FIGS. 1A and 1B.
Figure 1D:
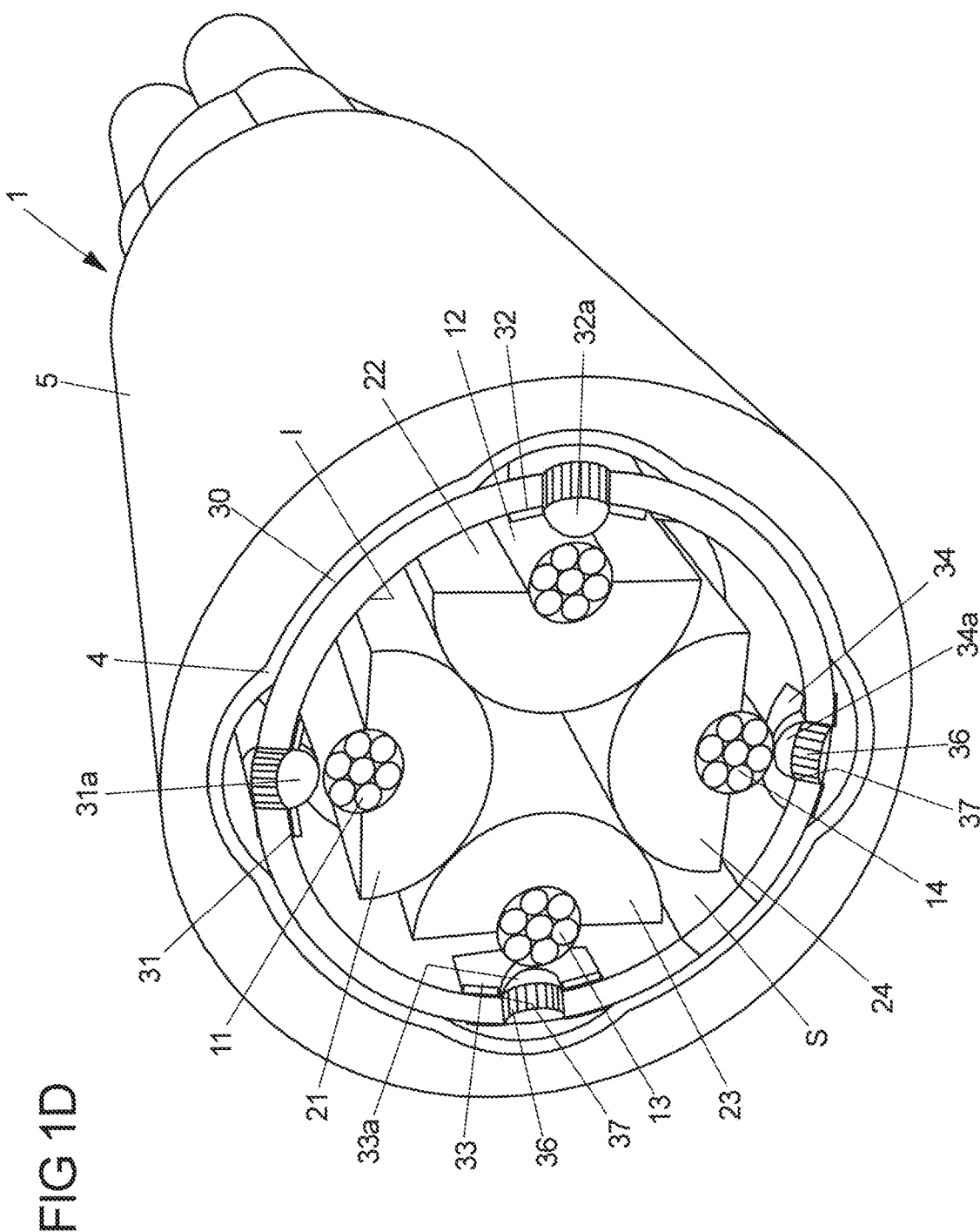
FIG. 1D is a transverse section through a perspective view of the electrical cable of FIGS. 1A through 1C.
Figure 2A:
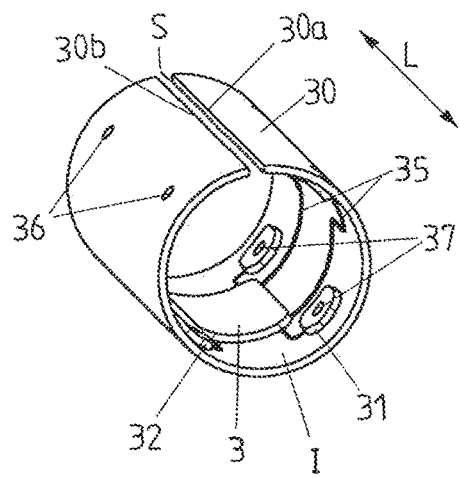
FIG. 2A is a perspective view showing the flexible carrier of FIGS. 1A through 1D together with the electrical device mounted thereon.
Figure 2B:
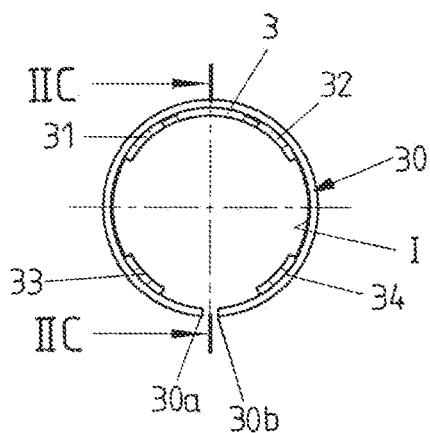
FIG. 2B is a transverse sectional view of the arrangement of FIG. 2A.
Figure 2C:
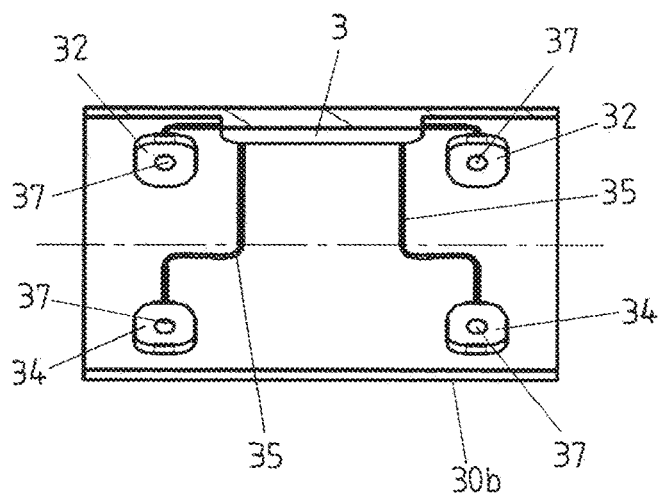
FIG. 2C is a longitudinal section through the arrangement of FIG. 2A.

The perspective transverse sectional view of FIG. 1D illustrates in detail the arrangement of the flexible carrier 30 described above with reference to FIGS. 2A through 2D on an electrical cable 1 of the type shown in FIGS. 1A through 1C.

Flexible carrier 30 encloses wires 11, 12, 13, 14 of electrical cable 1. In the exemplary embodiment, wires 11, 12, 13, 14 are partially freed from their respective insulation 21, 22, 23 or 24 in the region enclosed by flexible carrier 30, so that the connecting elements 31, 32, 33, 34 projecting from inner side I of flexible carrier 30 can each be brought into electrical contact with an associated one of wires 11, 12, 13, 14. Contact between a respective connecting element 31, 32, 33, 34 and the associated (partially exposed) wire 11, 12, 13, 14 of electrical cable 1 is here not established directly, but (indirectly) via a respective connection region 31a, 32a, 33a, 34a, via which a respective electrical connecting element 31, 32, 33, 34 is connected to the associated wire 11, 12, 13, 14 of electrical cable 1.

In the present case, connection regions 31a, 32a, 33a, 34a are formed by material-to-material connection points, for example, in the form of solder points. This means that a respective electrical connecting element 31, 32, 33, 34 is connected to the associated wire 11, 12, 13, 14 of electrical cable 1 via the respective connection region 31a, 32a, 33a, 34a by material-to-material bonding. In the exemplary embodiment, the material-to-material connection takes the form of a soldered connection (formed by electrical soldering, for example). The solder is introduced through the respective through-hole 36 in flexible carrier 30 and the associated passage 37 in the respective connecting element 31, 32, 33, 34.

The material used as solder may be tin, for example. Suitable materials for connecting elements 31-34 are, for example, copper, silver, gold and tin.

FIG. 1D further illustrates that flexible carrier 30 bears inwardly (i.e., toward the interior of the cable) against wires 11, 12, 13, 14 of electrical cable 1 (i.e.; against the stripped portions thereof) via electrical connecting elements 31, 32, 33, 34 (and the associated connection regions 31a, 32a, 33a, 34a).

Radially outwardly adjacent to the flexible carrier is a cable shield 4 which, in the exemplary embodiment, takes the form of a shielding film and which surrounds wires 11, 12, 13, 14 of electrical cable 1 annularly in cross section in the manner of a sheath. In the exemplary embodiment, cable shield 4 is non-conductive on its side facing the interior of the cable. This is intended, in particular, to prevent electrical contact with electrical connecting elements 31, 32, 33, 34 and the associated connection regions 31a, 32a, 33a, 34a.

Specifically, cable shield 4 may be formed of, for example, a plastic film having a metal coating applied thereto or vapor-deposited thereon, the metallic side of the cable shield facing radially outward.

The outermost layer of electrical cable 1 is formed by a cable jacket 5, which encloses the entire cable, forming a (flexible) outer sheath for it.

The electrical device 3 mounted on flexible carrier 30; i.e., the inner side I thereof (compare FIGS. 2A through 2D), is not visible in the sectional view of FIG. 1D; it is located outside the selected sectional plane.

Figure 3:
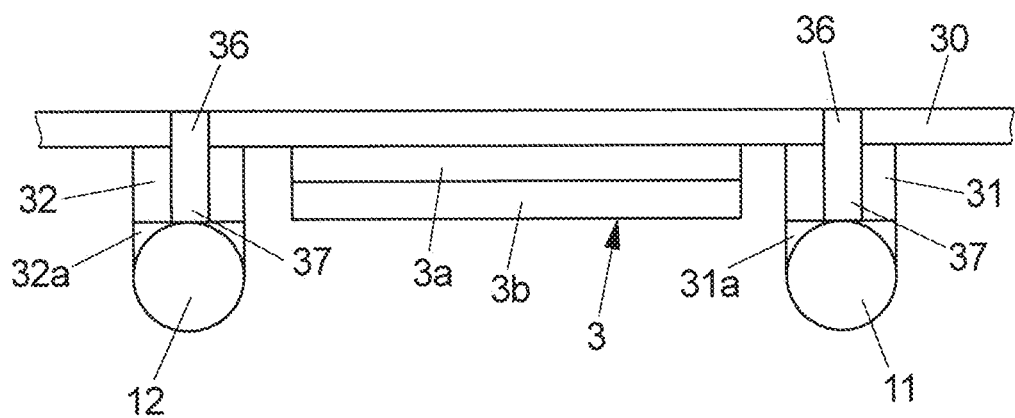
FIG. 3 is a schematic sectional view showing a portion of the flexible carrier together with an electrical device mounted thereon, as well as associated connecting elements, the section being taken such that it intersects both the electrical device and two associated connecting elements.

FIG. 3 shows a schematic section through flexible carrier 30 in the region of electrical device 3 and two connecting elements 31, 32, and also shows two wires 11, 12 of electrical cable 1 and their connection to the associated electrical contact points 31, 32.

According to FIG. 3, flexible carrier 30 is made of a thin carrier film in the form of a PVC film, for example. The thickness of flexible carrier 30 may be in the range of between 10 and 40 µm, for example.

Electrical device 3 is mounted on inner side I of flexible carrier 30, which faces wires 11, 12 of electrical cable 1. Electrical device 3 includes a chip 3a having, for example, a carrier made of silicon and semiconductor structures formed (etched) thereon. A further (insulating) layer 3b (non-conductive passivation layer), for example, of $SiO_2$, may be inwardly adjacent thereto.

FIG. 3 further illustrates how wires 11, 12 of electrical cable 1 are electrically contacted and fixed by material-to-material bonding via the associated contact points 31, 32 as well as corresponding connection regions 31a, 32a. Connection regions 31a, 32a, each in the form of, for example, a solder, have been deposited on wires 11, 12 through through-holes 36 provided in carrier 30 for this purpose and associated passages 37 provided in electrical connecting elements 31, 32 in alignment with through-holes 36.

FIGS. 4A through 4D illustrate a modification of the arrangement of FIGS. 2A through 2D, the essential difference being that in the exemplary embodiment of FIGS. 4A through 4D, only two pairs 31, respectively 32, of electrical contact points are connected to electrical device 3, and not four pairs 31, 32, 33, 34, as is the case in FIGS. 2A through 2D. Accordingly, the flexible carrier 30 shown in FIGS. 4A through 4D, including the electrical device 3 mounted thereon as well as electrical contact points 31, 32 and associated connecting conductors (conductive traces 35), is designed to establish electrical contact between a device 3 and a two-wire electrical cable.

Figure 5:
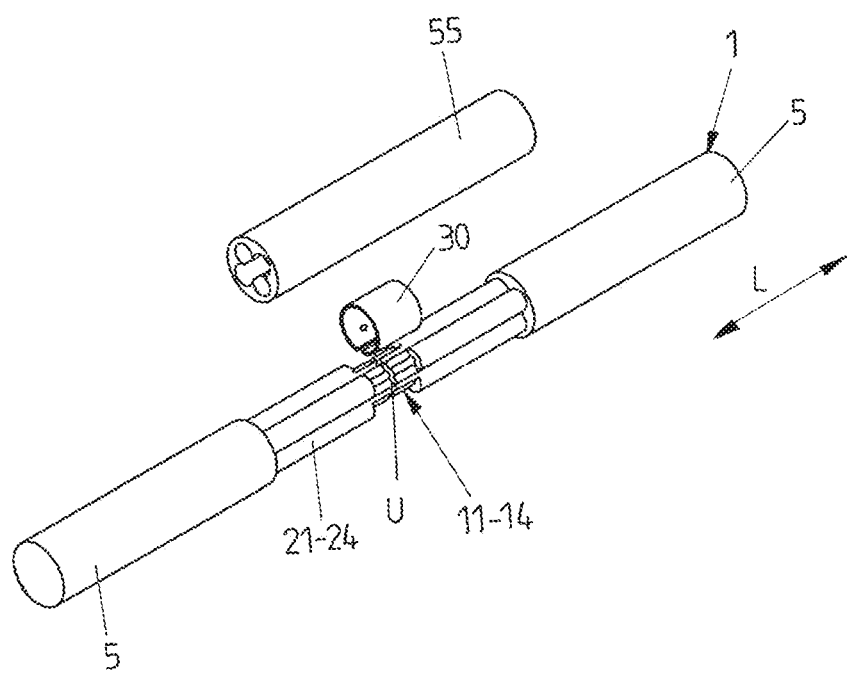
FIG. 5 is an exploded view of a first modification of the electrical cable of FIGS. 1A through 1D.

FIG. 5 shows a modification of the electrical cable 1 of FIGS. 1A through 1D, the essential difference being that in FIG. 5, cable jacket 5 is interrupted in the region of flexible carrier 30 and replaced with an overmold 55 that surrounds flexible carrier 30 on the outside and, in the exemplary embodiment, also the portions of wires 11-14 immediately adjacent thereto in the axial direction (along cable direction L).

Figure 6A:
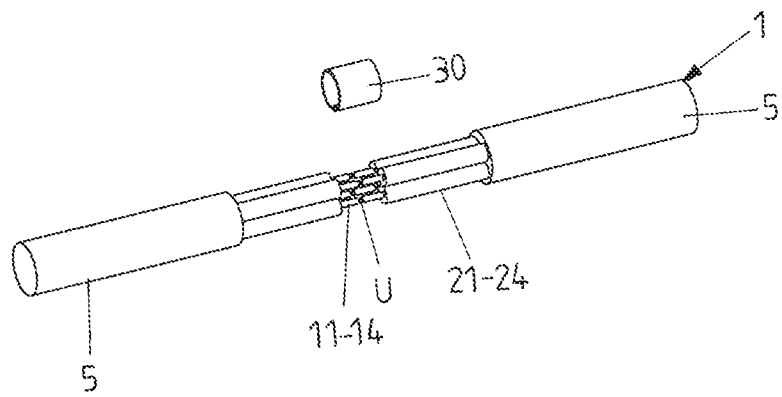
FIG. 6A is a view illustrating a second modification of the electrical cable of FIGS. 1A through 1D.
Figure 6B:
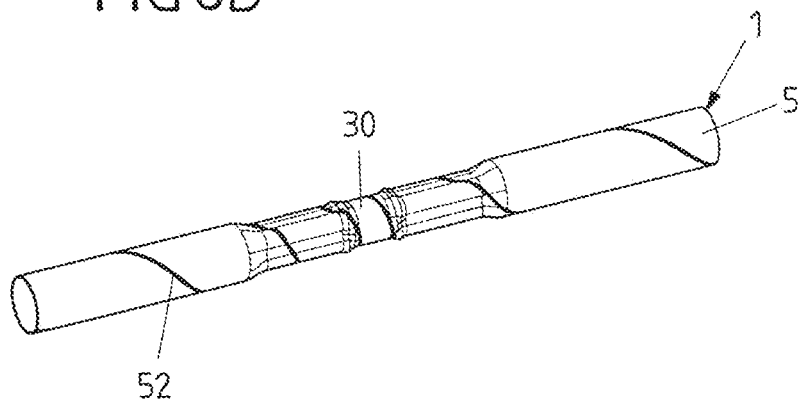
FIG. 6B is a further view of the electrical cable of FIG. 6A.

FIGS. 6A and 6B depict a further modification of the electrical cable 1 of FIGS. 1A through 1D. In the embodiment of an electrical cable 1 illustrated in FIGS. 6A and 6B, a tape 52 is applied as an insulator to the outer side of cable jacket 5. By way of example, tape 52 also covers a region of electrical cable 1 that is freed from cable jacket 5 in the vicinity of flexible carrier 30.

To manufacture any of the arrangements according to the above-described FIGS. 1A through 6B, flexible carrier 30, together with electrical device 3, is rolled over the wires 11, 12—and, where applicable, 13, 14—of electrical cable 1, or is slid over the wires of electrical cable 1 in an already rolled state, (after insulation 21, 22—and, where applicable, 23, 24—of the wires has been at least partially removed in the region to be encompassed by flexible carrier 30 in order to enable electrical contacting of electrical device 3, it being possible to accomplish such partial removal of the insulation thermally and/or mechanically).

For purposes of electrically contacting (and at the same time connecting) electrical device 3 to the stripped portions of wires 11, 12 (and, where applicable, 13, 14), a connection is made through a respective through-hole 36 of flexible carrier 3 and a passage 37 in alignment therewith in the respective electrical connecting element 31, 32 (and, where applicable, 33, 34) by soldering, welding or by an adhesive bonding process (using an electrically conductive adhesive). If necessary, flexible carrier 30 and/or electrical device 3 may additionally be provided with a potting compound, an adhesive compound or an overmold as protection.

In further steps, cable shield 4 and cable jacket 5 are applied, the latter, for example, by extrusion, shrink-fitting or injection-molding.

Flexible carrier 30 and electrical device 3 are sufficiently flexible to be rolled up to a sufficiently small radius so as to enclose wires 11, 12 (and, where applicable, 13, 14) of electrical cable 1 in such a way that they can be accommodated between these wires and an outer cable shield 4 and/or an outer cable jacket 5.

Figure 7B:
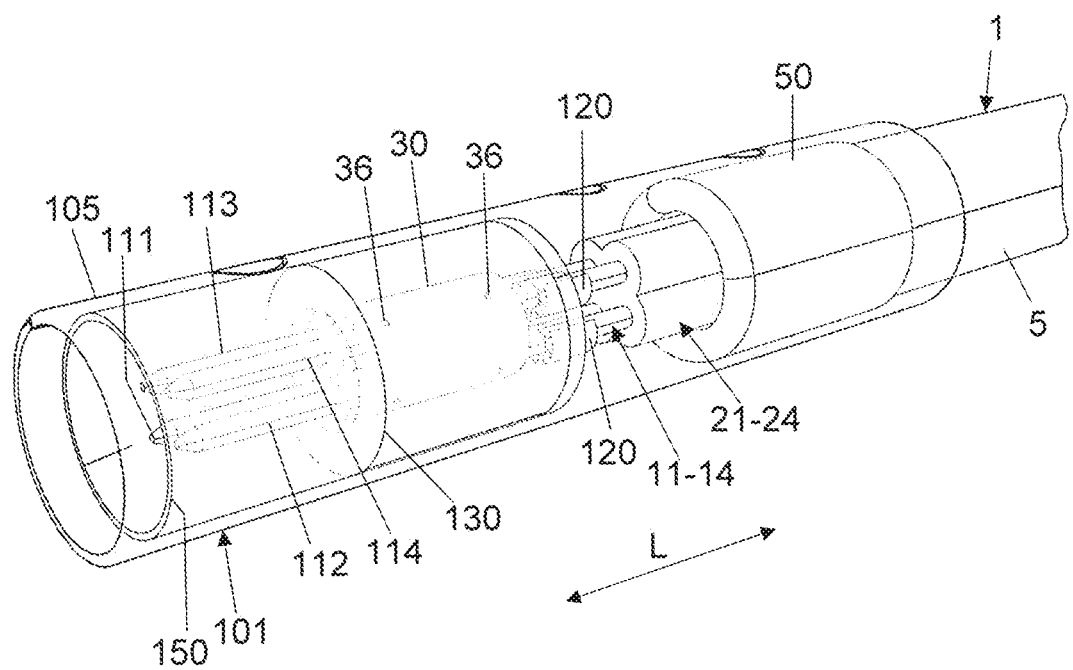
FIG. 7B is a perspective, partially transparent view of the arrangement of FIG. 7A.

FIGS. 7A and 7B illustrate an application of the flexible carrier 30 described above with reference to FIGS. 2A through 2D, and an electrical device 3 mounted thereon, on an electrical connector 101 which, in the exemplary embodiment, is used for pre-terminating an electrical cable 1. By way of example, electrical connector 101 has a total of four connector elements 111, 112, 113, 114, and is accordingly designed as connector for a four-wire electrical cable 1 (having four wires 11-14).

Connector 101 is connected and electrically contacted to electrical cable 1 by the wires 11-14 of electrical cable 1 or, to be more precise, the ends of wires 11, 12, 13, 14 that are freed from insulation 21-24, each being connected to a respective one of connector elements 111, 112, 113, 114 of connector 101. In the exemplary embodiment, the connection is made by via connecting members 120, each of which connects one of wires 11-14 to one of connector elements 111-114 and which are here in the form of crimp elements.

In addition to connector elements 111, 112, 113, 114, connector 101 further has an outer conductor 105, which is configured as a sleeve and surrounds connector elements 111, 112, 113, 114 annularly in cross section. Outer conductor 105 is electrically connected to shield 4 of electrical cable 1 and, in the exemplary embodiment, bears against electrical cable 1 via a supporting element 50, for example, in the form of a support crimp.

Disposed between electrical connector elements 111, 112, 113, 114 and outer conductor 105 are a protective element (silicon protector 130) and an overmold 150 surrounding protective element 130.

In the exemplary embodiment, connector elements 111-114 are each configured in two parts in the axial direction; i.e., along their direction of longitudinal extent, which here coincides with longitudinal cable direction L. This means that each of connector elements 111, 112, 113, 114 has a respective discontinuity U (compare FIG. 8C), so that a respective connector element 111, 112, 113, 114 is composed of two separate sub-elements disposed one behind the other along direction of extent L and separated by said discontinuity U.

Connector elements 111, 112, 113, 114 of electrical connector 101 are encompassed by a flexible carrier 30 in the manner illustrated in FIGS. 2A through 2D. As described with reference to FIGS. 2A through 2D, flexible carrier 30 has an electrical device 3 on its inner side I facing connector elements 111, 112, 113, 114, which electrical device is brought into electrical contact with said connector elements. To this end, flexible carrier 30 is provided (on its inner side I) with electrical connecting elements 31, 32, 33, 34, which are each connected to electrical device 3 via electrical conductors (conductive traces 35) and are each pairwise in electrical contact with one of connector elements 111, 112, 113, 114. In the present exemplary embodiment, contacting is accomplished by electrical device 3 bridging the above-described discontinuity U of electrical connector elements 111, 112, 113, 114.

FIG. 7B further shows through-holes 36 in flexible carrier 30, through which electrical connecting elements 31-34 are fixed to electrical connector elements 111, 112, 113, 114, in particular by (electrical) soldering.

Figure 8A:
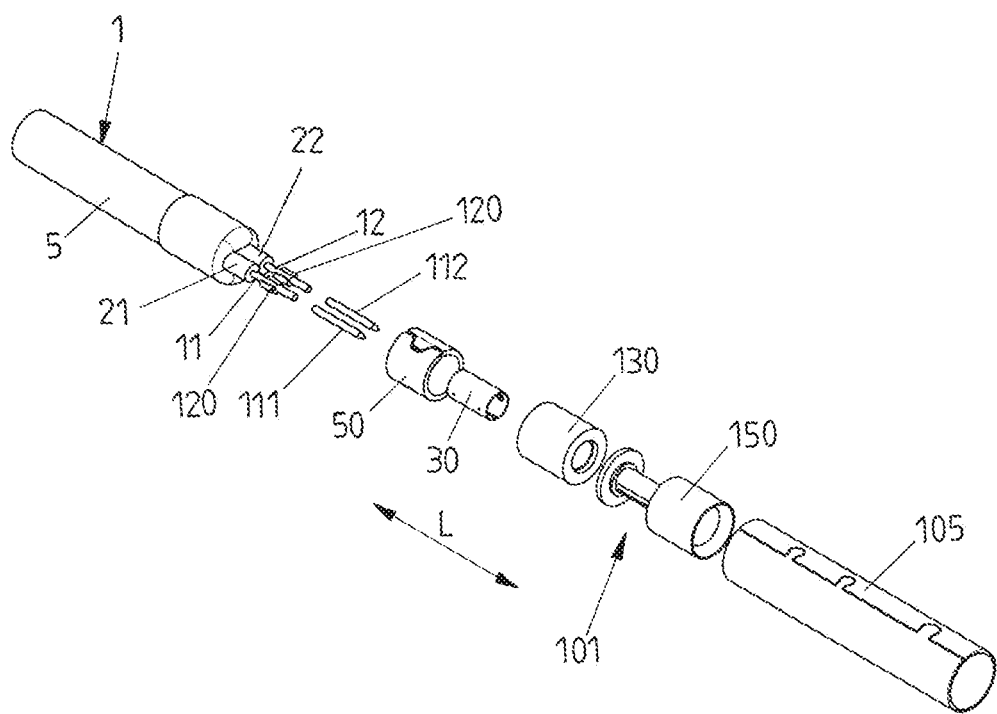
FIG. 8A is a view depicting a modification of the arrangement of FIG. 7A with a connector for a two-wire electrical conductor.
Figure 8B:
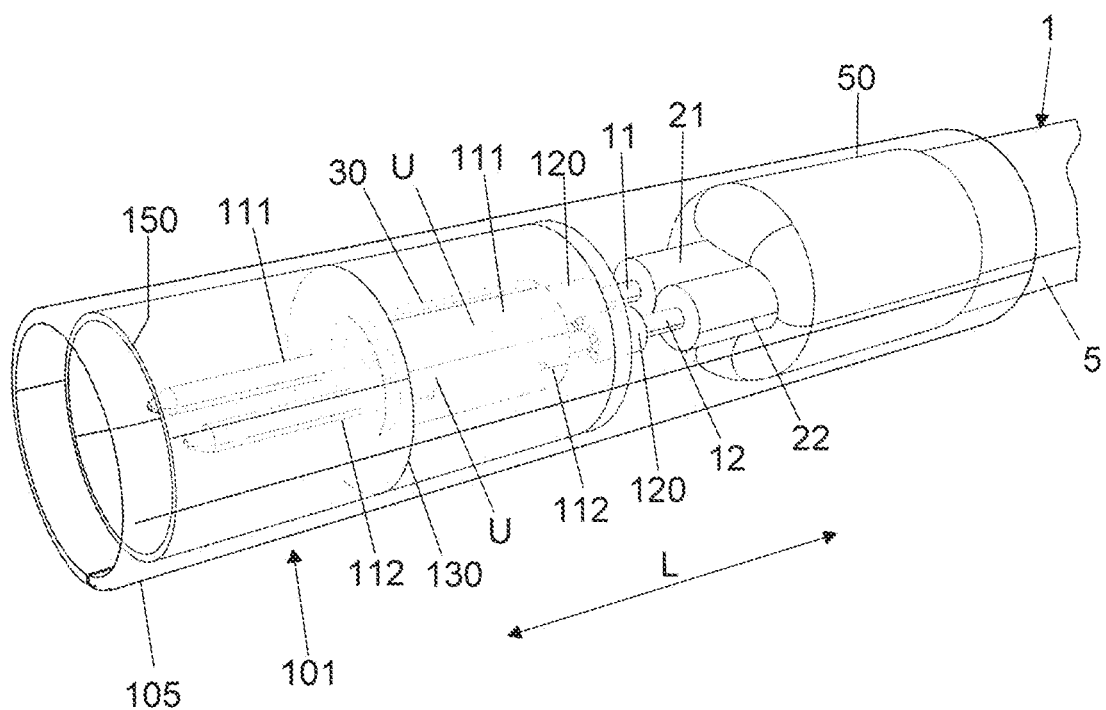
FIG. 8B is a perspective, partially transparent view of the arrangement of FIG. 8A.

FIGS. 8A and 8B show a modification of the arrangement of FIGS. 7A and 7B (electrical connector 101 with associated electrical cable 1), the main difference from FIGS. 7A and 7B being that in the exemplary embodiment of FIGS. 8A and 8B, electrical cable 1 is in the form of a two-wire electrical cable, and that electrical connector 101 accordingly has two connector elements 111, 112 extending along longitudinal direction L.

Figure 8C:
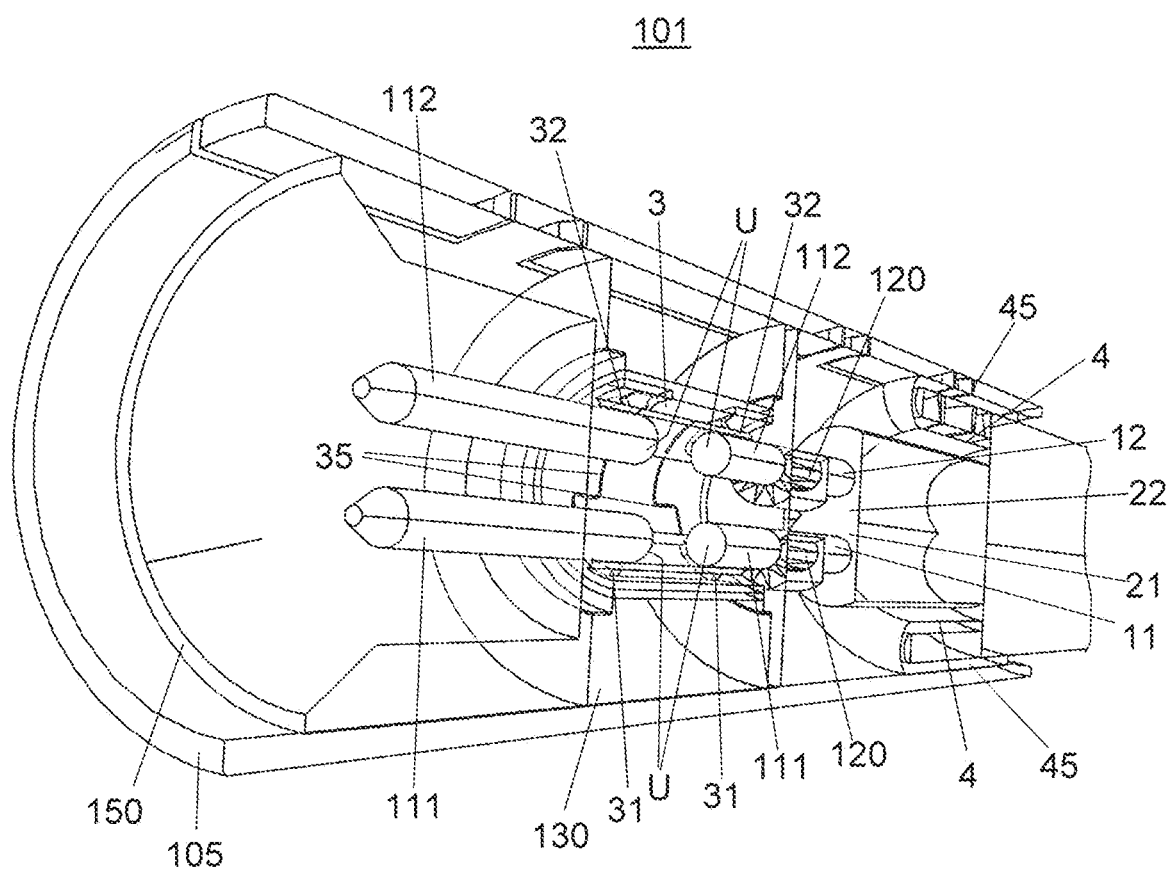
FIG. 8C is a perspective longitudinal section through the arrangement of FIGS. 8A and 8B.

The partially cut-away view of FIG. 8C shows further details, such as the electrical device 3 mounted on flexible carrier 30 as well as the discontinuity U in each of electrical connector elements 111, 112. In particular, the cut-away view of FIG. 8C shows that electrical device 3 is in electrical connection with two pairs of electrical connecting elements 31, 32 via electrical conductors (conductive traces 35), which pairs of electrical connecting elements are arranged on the inner side of flexible carrier 30, which faces the interior of the connector, each pair (31, respectively 32) being in electrical contact with a respective one of electrical connector elements 111, 112. Flexible carrier 30 at the same time bears against electrical connector elements 111, 112 (via electrical connecting elements 31, 32).

Figure 8D:
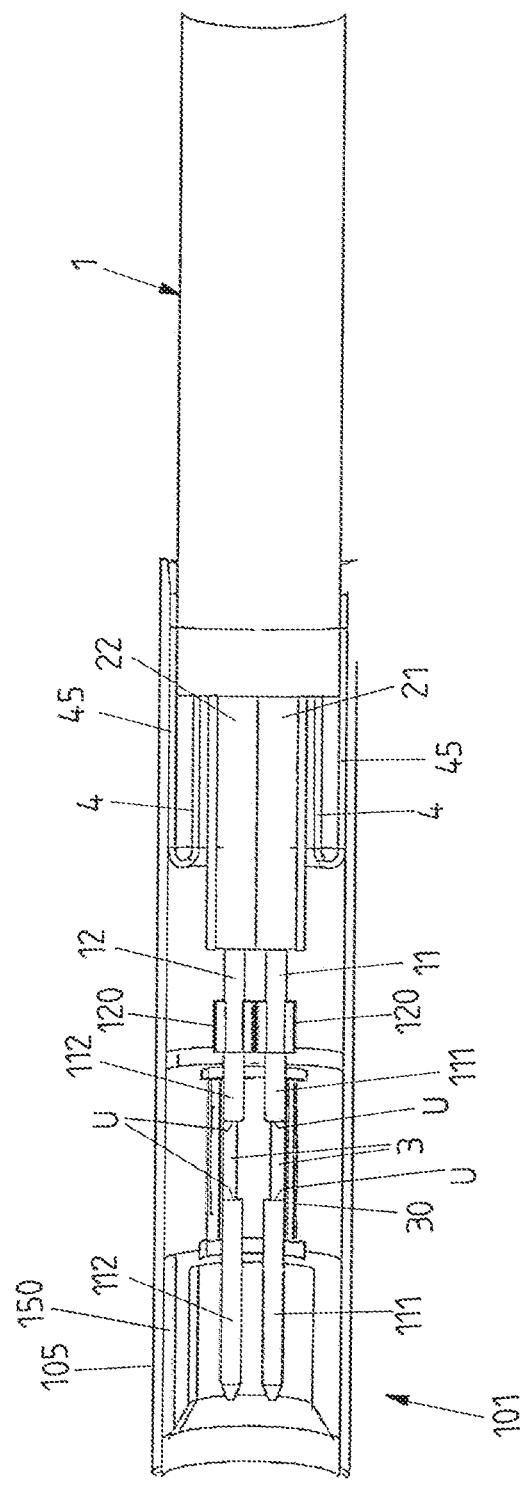
FIG. 8D is a further longitudinal section through the arrangement of FIGS. 8A and 8B.

As is apparent from FIG. 8D, shield 4 of electrical cable 1 is folded back at its connector-side end portion 45. Via the folded-back connector-side end portion 45, shield 4 of electrical cable 1 is in electrical contact with connector-side outer conductor 105. In the present case, this is accomplished by folded-back connector-side end portion 45 of cable shield 4 extending under outer conductor 105 and lying against the inner wall thereof, which faces the interior of the connector.

Figure 9:
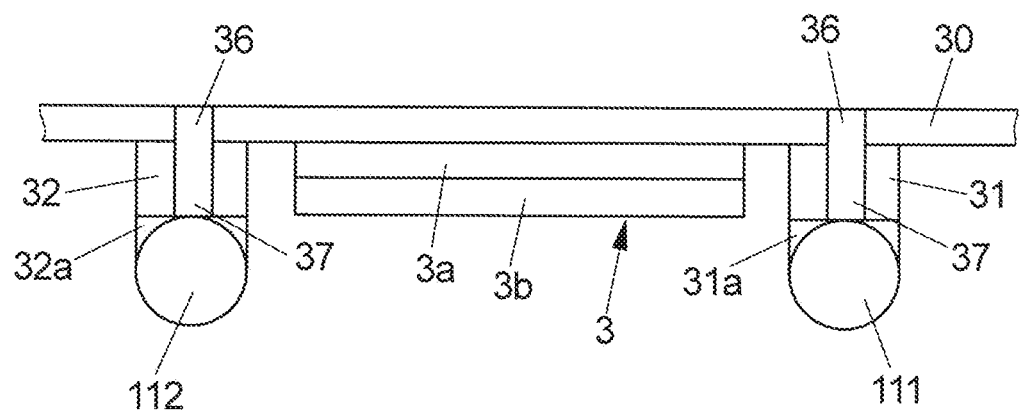
FIG. 9 is a view showing an arrangement according to FIG. 3, but for connection to an electrical connector.

The sectional view of FIG. 9, which shows a portion of flexible carrier 30 in the region of electrical device 3, is essentially similar to the view in FIG. 3, with a difference being that FIG. 3 shows electrical device 3 and flexible carrier 30 together with wires 11, 12 of an electrical cable, while FIG. 9 concerns the contacting of electrical device 3 to connector elements 111, 112 of an electrical connector 101.

Flexible carrier 30 and electrical device 3 are configured here as described above with reference to FIG. 3. Electrical contacting of the associated connector elements 111, 112 is in each case accomplished via a connection region 31*a*, respectively 32*a*, and specifically by material-to-material bonding, such as by soldering, welding or adhesive bonding. In order to make the connection, the necessary bonding material, for example a solder, can be applied to the respective connector element 111, 112 through the respective through-hole 36 of flexible carrier 30 and the passage 37 in alignment therewith in the respective connecting element 31, 32 associated therewith.

The provision of connector 101 with a (rolled) flexible carrier 30 and an electrical device 3 mounted on the inner side thereof is accomplished in a similar way as described above for an electrical cable 1. Accordingly, flexible carrier 30, together with the electrical device 3 mounted thereon, is rolled around connector elements 111, 112—and, where applicable, 113, 114—of connector 101, or is slid over them in an already rolled state. Subsequently, carrier-side connecting elements 31, 32—and, where applicable, 33, 34—are permanently electrically contacted to the associated connector elements, and preferably so by material-to-material bonding, such as by soldering, welding or adhesive bonding. The material required for this is introduced to the contact points through passages 36 in flexible carrier 30 and through the passages 37 in alignment therewith in connecting elements 31, 32 (and, where applicable, 33, 34).

In addition, contact elements 111, 112 (and, where applicable, 113, 114) are overmolded with plastic in some regions thereof. Furthermore, flexible carrier 30 and the electrical device 3 mounted thereon may be provided with protection on the outside, for example, by means of a potting or adhesive compound or by means of an overmold of plastic.

The connection of connector elements 111, 112 (and, where applicable, 113, 114) to the wires of a two-wire electrical cable (STP) or a four-wire electrical cable (STQ) may be accomplished by welding or crimping.

Furthermore, an outer conductor 105, for example in the form of a metallic sleeve, may be mounted on connector 101 as an outermost layer. This sleeve may in turn be in electrical contact with shield 4 of the associated electrical cable 1.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. An electrical cable comprising:
   at least two wires extending side by side along a longitudinal cable direction;
   an insulation by which the wires are electrically insulated from each other;
   an electrical device that is in electrical contact with the respective wires; and
   a flexible carrier which surrounds the wires annularly in cross section, the electrical device being mounted on an inner side of the flexible carrier which faces the wires.

2. The electrical cable as recited in claim 1, wherein the electrical device is a flexible semiconductor device.

3. The electrical cable as recited in claim 1, further comprising electrical conductors disposed on the flexible carrier, each of the electrical conductors extending from the electrical device to a respective one of a plurality of electrical connecting elements by which the electrical device is in electrical contact with the wires.

4. The electrical cable as recited in claim 3, wherein the electrical connecting elements are arranged on the flexible carrier as rigid electrical connection points by which the flexible carrier rests against the wires.

5. The electrical cable as recited in claim 4, wherein the electrical connecting elements are formed on the flexible carrier as rigid projections extending from the carrier toward the wires.

6. The electrical cable as recited in claim 3, wherein the electrical connecting elements each have a passage in alignment with an associated through-hole in the flexible carrier.

7. The electrical cable as recited in claim 6, wherein the flexible carrier is fixed to the wires through the passages in the connecting elements.

8. The electrical cable as recited in claim 7, wherein the flexible carrier is fixed by material-to-material bonding to the wires through the passages in the connecting elements.

9. The electrical cable as recited in claim 3, wherein two of the connecting elements are provided and are on the flexible carrier spaced from each other along the longitudinal cable direction such that each of the wires enclosed by the flexible carrier are contacted.

10. The electrical cable as recited in claim 1, wherein at least one of the wires has a discontinuity at a location at which the electrical device is disposed, and wherein the discontinuity is bridged by the electrical device.

11. The electrical cable as recited in claim 1, wherein the insulation of the wires is partially removed at a location at which the electrical device is disposed so as to permit electrical connection of the electrical device.

12. The electrical cable as recited in claim 11, wherein the insulation of the wires is removed at the location at which the electrical device is disposed along an entire longitudinal extent of the flexible carrier in the longitudinal cable direction.

13. The electrical cable as recited in claim 11, wherein the flexible carrier bears inwardly against the wires at the location at which the electrical device is disposed and the insulation of the wires is partially removed.

14. The electrical cable as recited in claim 1, wherein a longitudinal extent of the flexible carrier along the longitudinal cable direction is less than 10% of a longitudinal extent of the electrical cable.

15. The electrical cable as recited in claim 1, further comprising a cable shield which surrounds an outside of the wires, wherein the flexible carrier is disposed between the wires and the cable shield.

16. The electrical cable as recited in claim 1, wherein the electrical device is flexible and rolled with the flexible carrier about the at least two wires.

17. The electrical cable as recited in claim 1, further comprising at least two electrical conductors arranged on the inner side of the flexible carrier extending from the electrical device, each of the electrical conductors being in electrical contact with one of the at least two wires.

18. The electrical cable as recited in claim 17, wherein each of the electrical conductors is electrically connected to a respective one of the at least two wires by a connecting element which is in electrical contact with the respective one of the at least two wires and by a material-to-material bond which extends in each case through a passage in a respective one of the connecting elements.

19. The electrical cable as recited in claim 18, wherein the material-to-material bond is a solder introduced in each case into the passage of the respective one of the connecting elements through a respective through-hole in the flexible carrier which is aligned with the passage of the respective one of the connecting elements such that the flexible carrier is fixed to the wires.

20. A method for manufacturing an electrical cable having an electrical device disposed therein, the method comprising:
    at least partially removing insulation from at least two wires of the electrical cable in a region of the electrical cable at which the electrical device is to be arranged;
    mounting the electrical device on an inner side of a flexible carrier which will face the wires in an assembled state of the electrical cable;
    rolling the flexible carrier having the electrical device mounted thereon around the at least two wires, or sliding the flexible carrier in a rolled state together with the electrical device mounted thereon over the at least two wires; and
    introducing a material-to-material bonding through a through-hole in the flexible carrier and into a passage in alignment with the through-hole and extending through a connecting element which is in electrical contact with a respective one of the wires.

\* \* \* \* \*